United States Patent [19]

Fair et al.

[11] Patent Number: 5,336,641
[45] Date of Patent: Aug. 9, 1994

[54] RAPID THERMAL ANNEALING USING THERMALLY CONDUCTIVE OVERCOAT

[75] Inventors: Jim Fair, Meadow Vista; John Mehlhaff, Auburn, both of Calif.

[73] Assignee: Aktis Corporation, Rocklin, Calif.

[21] Appl. No.: 852,601

[22] Filed: Mar. 17, 1992

[51] Int. Cl.⁵ .................................... H01L 21/324
[52] U.S. Cl. ................................................ 437/248
[58] Field of Search .......................... 437/247, 248

[56] References Cited

U.S. PATENT DOCUMENTS

| | | | |
|---|---|---|---|
| 4,081,313 | 3/1978 | McNeilly et al. | 156/610 |
| 4,446,817 | 5/1984 | Crawley | 118/725 |
| 4,540,876 | 9/1985 | McGinty | 219/405 |
| 4,605,447 | 8/1986 | Brotherton et al. | 437/247 |
| 4,615,766 | 10/1986 | Jackson et al. | 437/247 |
| 4,621,413 | 11/1986 | Lowe et al. | 437/247 |
| 4,845,055 | 7/1989 | Ogata | 437/247 |
| 4,897,154 | 1/1990 | Chakravarti et al. | 156/643 |
| 4,956,538 | 9/1990 | Moslehi | 219/121.6 |
| 4,969,748 | 11/1990 | Crowley et al. | 374/1 |
| 5,047,611 | 9/1991 | Stultz | 219/405 |
| 5,073,698 | 12/1991 | Stultz | 219/405 |
| 5,139,971 | 8/1992 | Giridhar et al. | 437/247 |

OTHER PUBLICATIONS

Krause, S. J. et al., "Grain Growth Processes During Transient Annealing of As-Implanted, Polycrystalline-Silicon Films", *Mat. Res. Soc. Symp. Proc.* 35, pp. 721–726 (1985).

Kakkad, R., et al., "Crystallized Si Films by Low-Temperature Rapid Thermal Annealing of Amorphous Silicon", *J. Appl. Phys.* 65(5), pp. 2069–2072 (Mar. 1, 1989).

Biegelsen, D. K., et al., "Laser Induced Crystal Growth of Silicon Islands on Amorphous Substrates", *Laser and Electron-Beam Solid Interactions and Materials Processing*, pp. 487–494 (Elsevier North Holland, Inc. 1981).

Sedgwick, T. O., "Rapid Thermal Processing: How Well Is It Doing and Where Is It Going?", *Mat. Res. Soc. Symp. Proc.* 92, pp. 3–12 (1987).

*Primary Examiner*—Mary Wilczewski
*Attorney, Agent, or Firm*—Townsend and Townsend Khourie and Crew

[57] ABSTRACT

Method for improved heating uniformity during rapid thermal annealing through the use of a sacrificial layer covering the surface to be annealed. The composition and thickness of the layer are chosen to be opaque at the frequencies emitted by a radiant energy source, usually a xenon arc lamp, and also to be thermally conductive. The sacrificial layer absorbs the radiant energy and conducts the resulting heat to the surface to be annealed. After the annealing is complete, the sacrificial layer is etched away or left as an overcoat.

15 Claims, 4 Drawing Sheets

RAPID THERMAL ANNEALING USING THERMALLY CONDUCTIVE OVERCOAT

BACKGROUND OF THE INVENTION

The present invention relates to rapid thermal annealing and more specifically to the use of a temporary overcoat applied to a substrate before annealing.

Rapid thermal processing (RTP) is known in the prior art as a way to anneal semiconductor wafers and other substrates in order to crystallize amorphous Si films and activate doped Si films. For example see, R. Kakkad, et al., "Crystallized Si Films by Low-temperature Rapid Thermal Annealing of Amorphous Silicon", *J. Appl. Phys.* 65 (5), 1 Mar. 1989. Rapid thermal annealing is a process of heating semiconductor devices quickly, where the anneal time is on the order of 5 seconds. Very rapid thermal processing (VRTP) is a process where the substrate surface is heated to 1000° C. in less than 0.5 seconds. VRTP is also known in the art. For example see, "Rapid Thermal Processing: How Well Is It Doing and Where Is It Going?", *Mat. Res. Soc. Symp. Proc.* 92, 3 (1987).

One use of RTP and VRTP is solid phase recrystallization (SPC). Prior to SPC, a substrate will have on it one or more overlapping deposited silicon films which do not have a defined crystalline structure. Such silicon films are called amorphous silicon (a-Si). Heating an a-Si film to a sufficiently high temperature transforms it into a crystallized, or polysilicon, film.

Another use of RTP and VRTP is to integrate doped impurities into the crystal structure of a doped polysilicon film. The heat of RTP activates the impurities in the film, and increases the conductivity of the film. In a typical substrate processing operation, several films containing patterns of circuit elements are grown on or etched from the substrate, and then selected areas of the patterned films on the substrate are doped with impurities. The substrate is then heated and cooled, thus activating the doped regions.

Both a-Si films and polysilicon films can be heated effectively by exposing them to radiated light energy from a xenon arc lamp, however a-Si films generally absorb more energy in the range emitted by xenon lamps than do polysilicon films. The ability of these thin (250–2500 angstrom) films to absorb radiated energy is dependent on the thickness of the film, the amount of crystalline structure in the film, and the impurity content of the film. In general greater absorption, and therefore quicker heating, occurs in thicker films, which are more opaque to the radiated energy.

The temperature reached in an exposed film is not only a function of the absorbed energy, but also a function of the rate of heat loss by conduction to the structure underlying the film. This underlying structure is made up of the substrate and any previously processed layers. The term "layer" is used herein interchangeably with the term "film", however "layers" better describes a substrate where many films are laid one on top of the other. The rate of heat loss from a film is a function of the temperature difference between the film and its underlying structure, the heat capacity of the film, and the geometry of the boundary between the film and the underlying structure. As an example of the effect of geometry on heat loss, in a film containing an etched pattern of circuit elements, smaller features of the pattern will dissipate proportionally more heat to a cold substrate than a larger feature in a film of the same thickness. This is because a feature can dissipate heat into parts of the structure lying beyond the edges of the feature as well as into the structure directly under the feature, and a smaller structure has a larger edge-to-area ratio, giving it a higher heat transfer coupling to the underlying structure.

Heat conductivity is also a function of the heat capacity of the underlying structure. Thus, if a film to be annealed is overlying a film which acts as a thermal insulator, the film being annealed will cool slower than if the film is in direct contact with a thermally conductive substrate.

These unavoidable variations in radiant energy absorption and heat dissipation lead to a common problem associated with annealing a patterned substrate, namely uneven heating of an uneven film surface. Larger features, as compared with smaller features, will absorb proportionally more radiated energy, since the cross section exposed to the xenon lamp is greater, and larger features conduct heat less efficiently to the surface of the substrate. Thus, larger features tend to overheat as smaller features are heated to annealing temperatures. The overheating problem also arises when trying to uniformly heat thick, multilayer features. A thin feature is exposed to as much radiated energy as a thick feature of the same area, consequently a thick feature will heat faster due to increased opacity and less thermal coupling per unit mass to the underlying structure.

Another disadvantage of radiant heating, in addition to the inability to create uniform temperatures, is that a film to be annealed must be uppermost on the substrate, where it is able to absorb the radiant energy. To meet this requirement, many annealing steps must occur in the production process, each before the layer to be annealed is covered by other layers. For example, in a typical thin film transistor (TFT) process, SPC would occur in the early stages of the process, when the layer to be recrystallized is uppermost, and implant activation would occur in the later stages of the process, when the implanted layer is uppermost.

Radiant heating of thin film structures on glass substrates presents additional difficulties. Typical substrate glasses cannot withstand extended exposure to temperatures above the glass strain point (usually in the range of 575° C. to 650° C.). Because crystallization of a-Si films and implant activation by RTP or VRTP may require heat treatment above the glass strain point, damage to the glass substrate may occur because exposure times are too long at the power density levels typically available to RTP/VRTP (10–5000 W/cm$^2$).

To solve the problem of uneven temperatures, the substrate can be annealed in a convection furnace. However, this method also has its drawbacks. Furnace heating takes longer, and as 8 inch wafers become more common over 4 inch wafers, end-wafer heating problems will become more problematic. End-substrate heating problems also arise where the substrate is a glass substrate for a flat panel display, which can measure 8 inches across for a single device. Also, since the entire furnace chamber must be heated to the annealing temperature, the walls of the chamber are more likely to give off contaminants.

The substrate can be heated using a pinpoint laser scanning in two dimensions and adjusting the intensity of the beam to compensate for the variations in energy absorption and heat dissipation. However, for this approach to work properly, the intensity control of the laser must be closely aligned with the features on the substrate, which becomes increasingly complicated as feature size decreases. Laser annealing is also undesirable because of the high power densities required and the tendency for the large temperature gradients caused by spot scanning to damage substrates.

SUMMARY OF THE INVENTION

The present invention provides a method and apparatus for providing a uniform annealing temperature to semiconductor or other solid state device structures. In one embodiment of the invention, a relatively thick sacrificial (i.e. removable) absorption layer, typically of amorphous silicon or polysilicon, is deposited over an area of the device to be annealed. The sacrificial layer is then exposed to and absorbs radiant energy from either an arc lamp or laser. This energy is then dissipated by heat conduction to the underlying features or films. When annealing is complete, the absorption layer may be removed by selective etching methods well known in the art. The absorption layer may be deposited on the top side only, the bottom side only, or both sides of a substrate. Furthermore, the exact location, whether above or below, of the absorption layer relative to the device structures or films is not critical. In any case, uniform heating of the device structures or films will result because of the relatively short conduction path between absorption layer and device structure or film.

Removal of the sacrificial layer after annealing is optional and is not specifically required by the present invention. In some embodiments of the present invention, the overall process flow is such that presence of the sacrificial layer in the final product is acceptable. It is anticipated however that, in embodiments of the present invention which are applied to the fabrication of active matrix display devices, the sacrificial layer is removed after an annealing step so as not to interfere with the high overall light transmission requirement of active matrix display devices.

Because the film to be annealed is heated by conduction, the temperature across the film is more uniform. If one feature dissipates heat to the underlying structure faster than another feature, more heat is conducted to that feature from the sacrificial layer, since any film in thermal contact with the relatively massive sacrificial layer will tend towards the temperature of the sacrificial layer.

Another benefit of the present invention is that annealing steps can be combined. Since the sacrificial layer heats through conduction, features can be annealed even after they are no longer uppermost on the substrate. Thus, several overlapping layers can be placed on the substrate before an annealing step is needed. The reduction in the number of annealing steps reduces the cost of processing substrates and reduces the opportunity for defects to occur.

The present invention works with various substrates, but is especially useful with thin-film technology. One application which will benefit greatly from the present invention is in the field of active matrix displays. Active matrix displays often require a polysilicon film with widely isolated features overlying a glass or quartz substrate. Since the substrate is massive relative to the features, the substrate absorbs heat rapidly and acts as a cooling sink, absorbing proportionately more energy from smaller isolated features in the polysilicon film.

Yet another benefit of the present invention is that the sacrificial layer can be made opaque to the radiated energy, thus absorbing more energy than the relatively transparent thin films required by TFT. By absorbing more energy, less intense lamps can be used, and the layer to be annealed will be heated before the underlying substrate, regardless of the layer's transparency. This is especially important when a layer is a material which does not absorb xenon lamp wavelengths such as phosphor dye layers needing to be annealed.

Furthermore, the use of a sacrificial absorption layer can decrease the likelihood of glass substrate damage during VRTP annealing because, at a fixed power level, energy absorption and hence heating rate, can be increased many times. The net effect is that nearly all the radiant energy is absorbed at the surface within the sacrificial layer. Annealing of electrical features is achieved by direct conduction from the absorption layer and thermal exposure of the glass substrate is minimized because the entire anneal process takes place in a fraction of a second.

A further understanding of the nature and advantages of the invention may be realized by reference to the remaining portions of the specification and the accompanying drawings.

DESCRIPTION OF THE PREFERRED EMBODIMENT

FIG. 1 is a cross section of a semiconductor device 8 typical in the prior art in various stages of production. FIG. 1a shows a bare substrate 10. Substrate 10 can be formed of quartz, glass, or silicon, however the greatest benefits of the present invention are had with quartz or glass substrates, since they are mostly transparent to radiant energy. A polysilicon layer 12 is deposited over substrate 10 as shown in FIG. 1b. While polysilicon layer 12 can be deposited on substrate 10, there are many other methods well known in the art of semiconductor fabrication for creating films on substrate surfaces, each of which can be used with the present invention. Furthermore, polysilicon layer 12 is shown in FIG. 1b as being approximately 1000 angstroms thick, but other thicknesses may work equally well.

Figure 1A:
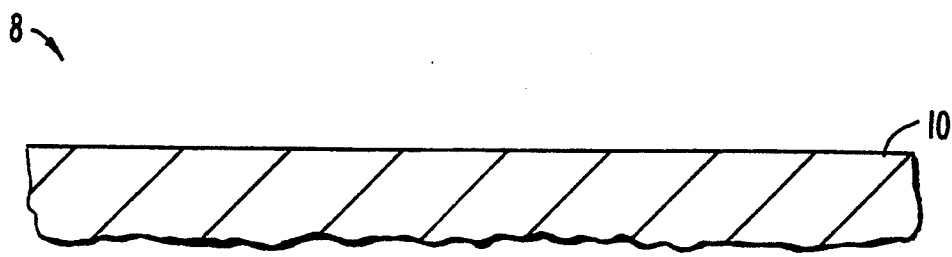
FIGS. 1a–1d are cross section of a thin film semiconductor device in various stages of production.
Figure 1B:
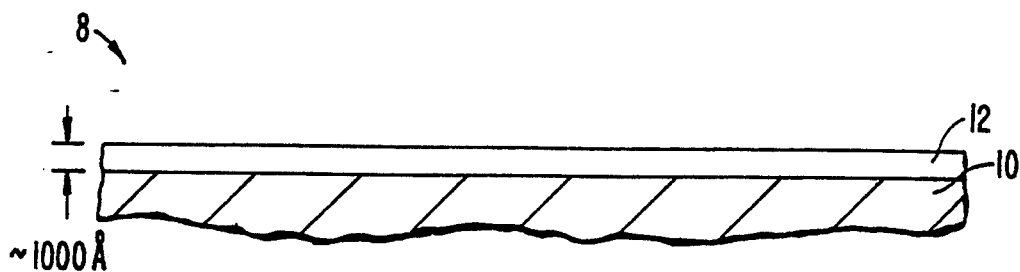
Figure 1C:
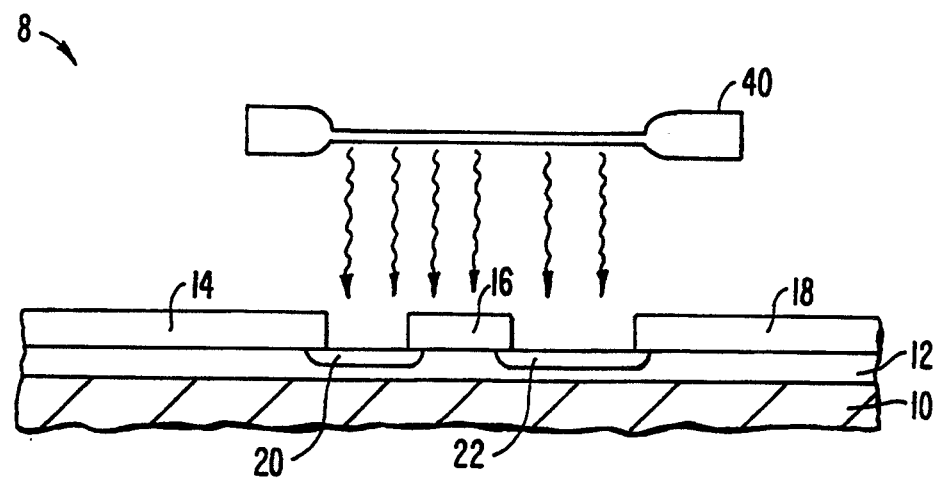

FIG. 1c shows the addition of oxide layers 14, 16, 18 over polysilicon layer 12, and a doped source region 20 and drain region 22. A xenon lamp 40 is used to activate dopants in doped source region 20 and doped drain region 22.

Figure 1D:
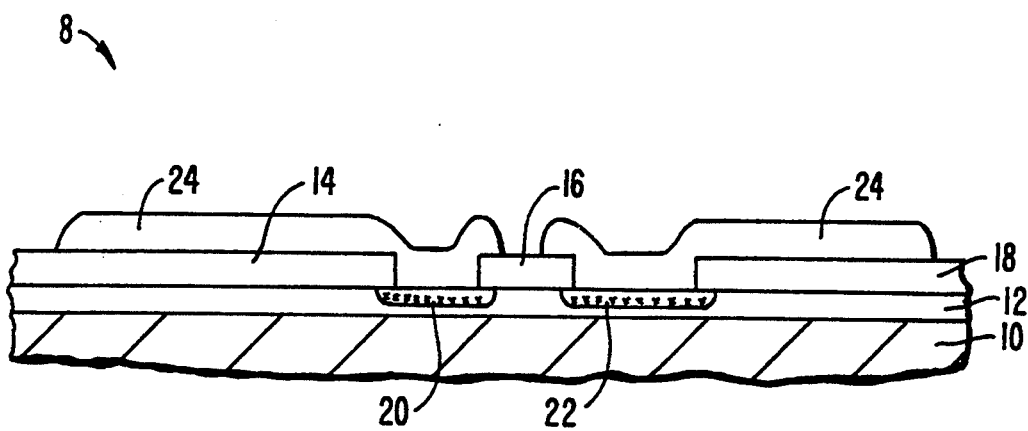

Finally, FIG. 1d shows the addition of a metal contact layer 24 to provide external connections to the source and drain regions 20, 22.

Although the present invention is applicable to a wide variety of patterns, FIG. 1 shows only one pattern, part of a typical thin film transistor. The features of the thin film transistor shown are formed by depositing an insulating a-Si or silicon dioxide layer, etching the insulating layer to form the features 14, 16, and 18, and then regions 20 and 22 are formed by ion implantation.

In the prior art, since heating is accomplished through radiation, the activation of dopants in source region 20 and drain region 22 must occur before contact layer 24 is formed during the metal deposition step shown in FIG. 1d. If any layers needing an anneal step are placed on the substrate subsequent to contact layer 24, a second annealing step is required at that time.

FIG. 2 illustrates the process of using a sacrificial layer during an anneal step. FIG. 2a shows a semiconductor device 100 in stages of production before annealing. Device 100 has a substrate 102 covered with a polysilicon film 104, oxide films 106, 108, 110, doped regions 108, and metal films 110.

Figure 2A:
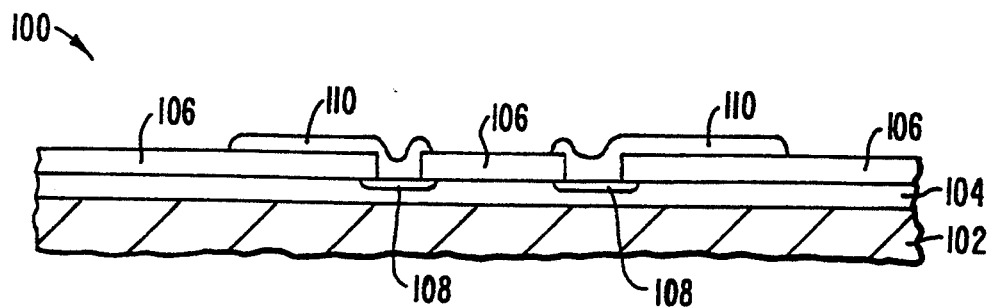
FIGS. 2a–2d are cross section of a particular embodiment of an in-process semiconducting device using a sacrificial layer in a conductive annealing process in accordance with the present invention.
Figure 2B:
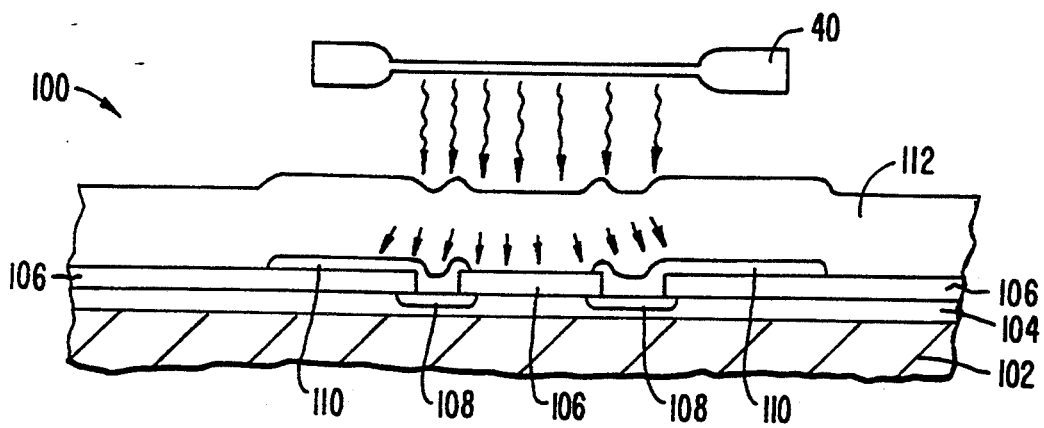

FIG. 2b shows device 100 covered with a sacrificial layer 112 of silicon 5000 angstroms thick, under a xenon lamp 40. Although one thickness and a particular radiant energy source are shown in FIG. 2b by way of example, the present invention can be practiced with sacrificial layers of other thicknesses, and using other radiant energy sources. Sacrificial layer 112 can be created by various methods well known in the prior art, such as chemical vapor deposition.

The radiant energy emitted by xenon lamp 40 is absorbed by sacrificial layer 112, which converts the absorbed energy into heat. Sacrificial layer 112, being in close contact with metal films 110, transfers the absorbed heat to metal films 110 as shown. While some radiant energy is not absorbed by sacrificial layer 112, a great majority of it is. The absorbed heat is then sufficient to heat each layer underlying sacrificial layer 112, even those layers not directly in contact with sacrificial layer 112.

Figure 2C:
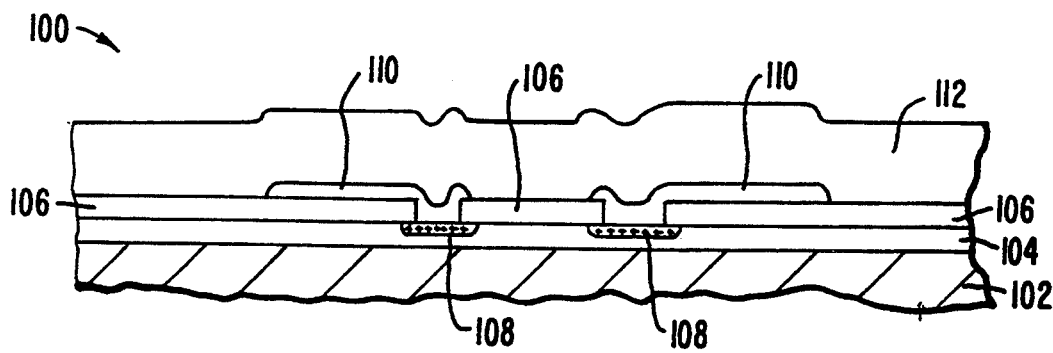

FIG. 2c shows device 100 after the annealing process is complete. Doped regions 108 are now activated regions. But one advantage to the present invention is that sacrificial layer 112 is able to smooth out temperature gradients in the various layers by supplying more heat to those layers which dissipate heat faster to underlying layers and substrate 102, thus insuring even heating of all the varied features on the surface of device 100.

Figure 2D:
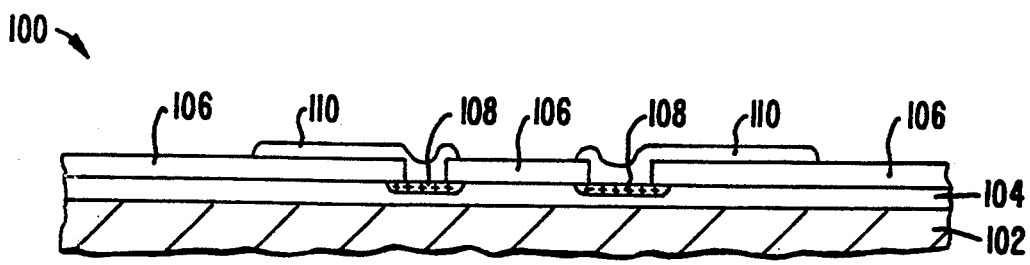

FIG. 2d shows device 100 after sacrificial layer 112 has been removed. After the annealing steps are completed, sacrificial layer 112 is no longer needed.

Figure 3:
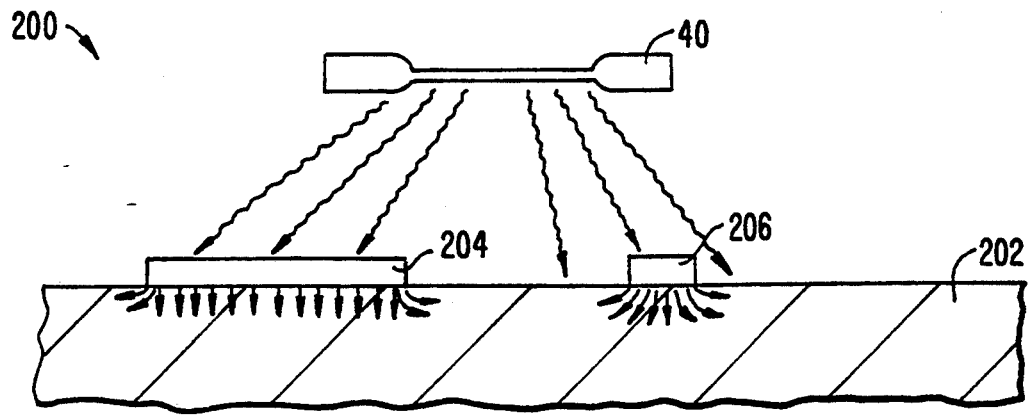
FIG. 3 is a cross section of an active matrix display undergoing rapid thermal annealing.

FIG. 3 illustrates a typical problem in the manufacture of active matrix displays, which require glass or quartz substrates. Substrate 202 is made of a clear glass or quartz suitable for active matrix displays. Features necessary for the operation of the display are formed on the surface of substrate 202. Two such features are shown in FIG. 3, a larger feature 204 and a smaller feature 206. Typically, features are formed by deposition of a smooth layer of polysilicon over a substrate and, using a negative mask, exposed areas are etched away to leave only the desired features. However, in more specialized applications, feature 204 and feature 206 might be phosphor dyes needing to be thermally processed. The annealing of blue phosphor dye layers presents particular problems in conventional thermal annealing, as blue phosphor is transparent to the wavelengths of light emitted by xenon lamp 40.

Substrate 202 is much more massive than features 204 and 206, and absorbs less of the wavelengths emitted by xenon lamp 40 when compared to the features on the substrate. Consequently, features 204 and 206 heat up faster than substrate 202, and dissipate the heat to the relatively cold substrate 202. The construction of active matrix displays typically requires space between each feature such that each feature is independently dissipating heat to substrate 202. Even if features 204 and 206 are formed of the same substance and have the same thickness, and therefore the same ratio of feature mass to dissipation surface area, smaller feature 206 will be able to dissipate more heat per unit mass than the larger feature 204 because feature 206 has proportionally more substrate mass beyond the edge of contact into which to dissipate heat. In other words, heat conductivity coupling between smaller feature 206 and substrate 202 is greater than between larger feature 206 and substrate 202.

Figure 4:
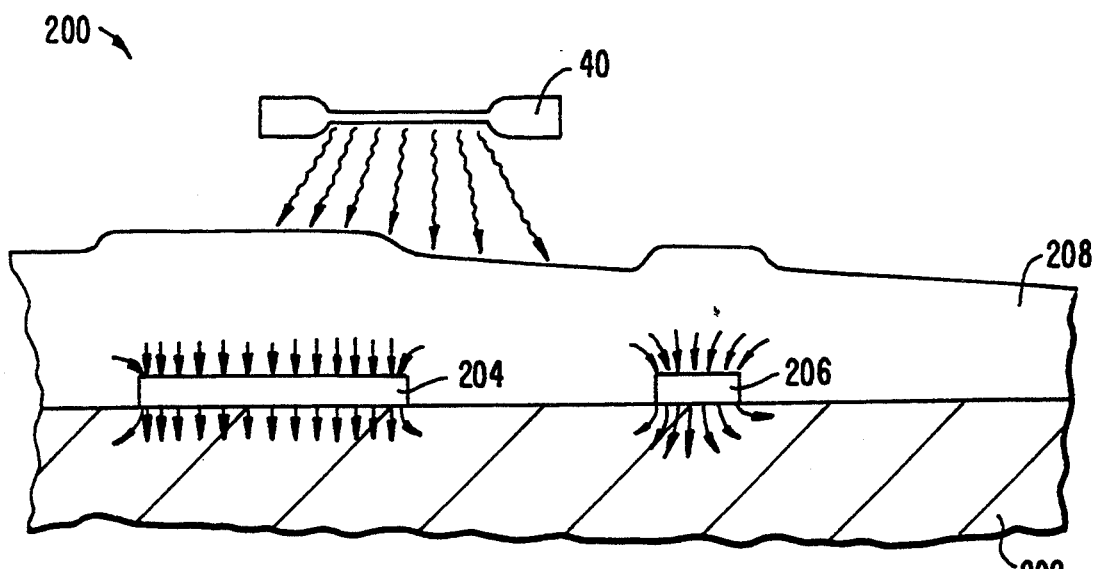
FIG. 4 is a cross section of an active matrix display undergoing rapid thermal annealing through heat conduction from a sacrificial layer.

FIG. 4 illustrates annealing active matrix display 200 using a sacrificial layer 208 applied over features 204 and 206 prior to an annealing step. The radiant energy from xenon lamp 40 is absorbed by sacrificial layer 208, and is in turn conductively transferred to features 204 and 206. As FIG. 4 shows, the same geometry which allows greater heat dissipation by smaller feature 206 allows quicker heat absorption from sacrificial layer 208. Also, because the heat is transferred conductively, and heat is conducted faster to a cold body than to a hot body, features 204 and 206 will tend to stay at the same temperature relative to each other as long as sacrificial layer 208 is acting as a heat source for both features. Furthermore, absorbed heat is independent of the type of material used to form features 204, 206.

Figure 5:
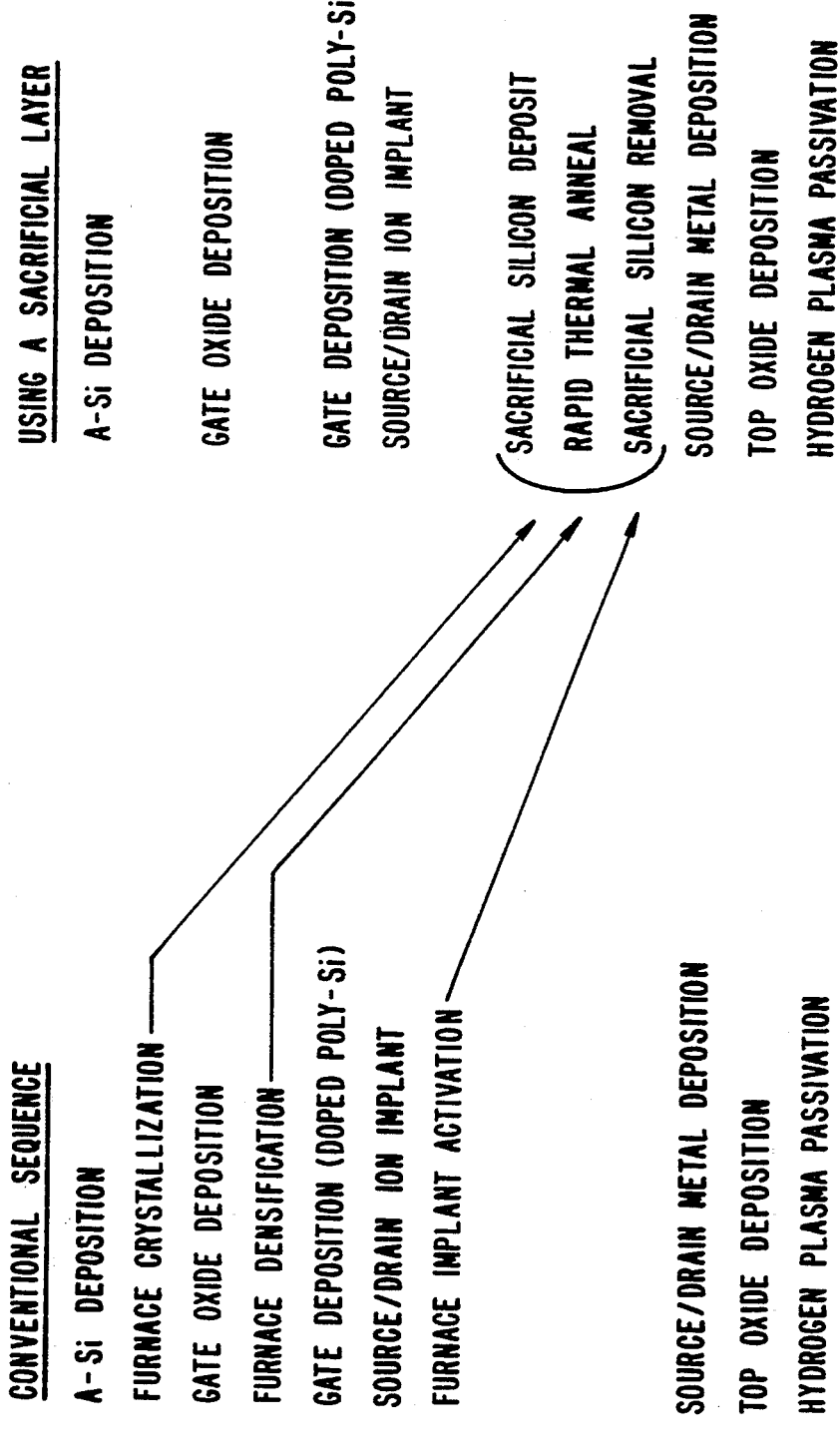
FIG. 5 is a table comparing the sequences required in conventional deposition and anneal processing and deposition and anneal processing in accordance with the present invention.

FIG. 5 is a table comparing deposition and anneal processing steps in a conventional process and in a process in accordance with the present invention. In conventional anneal processing, several time consuming furnace steps are required, whereas, in accordance with the present invention, many furnace steps can be replaced with one sacrificial silicon step, which involves the simpler steps of depositing a sacrificial layer over the circuit to be annealed, performing a rapid thermal anneal, and removing the sacrificial layer.

In the conventional sequence annealing a semiconductor device, an a-Si film is deposited onto the substrate. To convert the a-Si to crystallized polysilicon, the device is heated in a furnace. The time required for the furnace step is typically five minutes or more, and does not include a cooling period following the furnace step. After the device has cooled, a gate oxide layer is deposited over the device, and the device is returned to the furnace for densification of the gate oxide layer. After cooling for the second time, the gate is selectively doped with a pattern of polysilicon, and source/drain regions are implanted with ions.

The implanted ions must be activated into the source/drain regions, so the device must be heated for a third time. Then, metal layers and a top oxide layer are deposited, ending with a hydrogen plasma passivation step.

By contrast, in one embodiment of a semiconductor device processing system according to the present invention, a layer of a-Si is deposited over a substrate, the gate oxide is deposited, the gate is deposited, and the source/drain ion implantation takes place. The advantages of grouping similar process steps together is clear. Since masking and deposition is done without intervening furnace steps, processing is simplified, since self-masking techniques can be used, such as depositing or implanting more than one layer at a time, using the uppermost layers as masks for underlying layers.

Once the device has been implanted with the various layers, a sacrificial layer is deposited over the surface of the device, and that sacrificial layer, exposed to an arc lamp, uniformly heats the underlying layers. Once the rapid thermal annealing step is complete, the sacrificial layer is removed, and processing continues with the metal and top oxide deposition stages and hydrogen plasma passivation.

As will be understood by those familiar with the art, the present invention may be embodied in other specific forms without departing from the spirit or essential characteristics thereof. For example, the sacrificial layer can be used with devices having substrates other than glass, quartz or silicon, and the sacrificial layer need not be removed after its usefulness as a heat transfer mechanism has past. Therefore, the above description should not be taken as limiting the scope of the invention which is defined by the appended claims.

What is claimed is:

1. A method of heating a film on a substrate of a semiconductor device, comprising the steps of:
    processing the semiconductor device to create the film on the substrate, the film being an amorphous film;
    covering the film with a radiant energy absorbent layer;
    exposing said radiant energy absorbent layer to a radiant energy source for a predetermined period, said radiant energy absorbent layer absorbing some radiant energy from said radiant energy source;
    choosing said predetermined period such that said amorphous film is crystallized;
    dissipating some of said absorbed radiant energy from said radiant energy absorbent layer to the film as heat energy more uniformly than a radiant heat energy absorption distribution of the film alone; and
    removing said radiant energy absorbent layer from the semiconductor device.

2. The method of claim 1, wherein said predetermined period is sufficient to allow the film to reach a predetermined temperature by conductively absorbing heat from said radiant energy absorbent layer.

3. The method of claim 1, further comprising a step of processing the semiconductor device to provide a relatively inactive dopant region of the film, and wherein said exposing step further includes a step of choosing said predetermined period such that said dopant region is activated, wherein said relatively inactive dopant region is relatively inactive with respect to said dopant region after said exposing step.

4. The method of claim 1, further comprising a step of placing a plurality of underlying films between the substrate and the film such that the film is in thermal contact with said plurality of underlying films and said plurality of underlying films is in thermal contact with the substrate.

5. The method of claim 4, wherein said step of placing said plurality of underlying films is performed before the film is created.

6. The method of claim 1, where said exposing step is a rapid thermal annealing step.

7. The method of claim 1, wherein a plurality of films are created on the substrate and said plurality of films are simultaneously covered with said radiant energy absorbent layer, thereby annealing more than one film simultaneously.

8. The method of claim 7, wherein at least one film in said plurality of films is covered by said radiant energy absorbent layer but said one film is not annealed.

9. The method of claim 1, where said predetermined period is less than one second.

10. The method of claim 1, wherein said step of exposing said radiant energy absorbent layer to a radiant energy source comprises the steps of concentrating radiant energy into a line and sweeping said line across said radiant energy absorbent layer.

11. The method of claim 1, where the film is deposited on the substrate by chemical vapor deposition and the film forms circuit elements of a semiconductor circuit.

12. The method of claim 1, wherein said substrate is glass and said film comprises phosphor.

13. The method of claim 1, further comprising the step of removing said radiant energy source to allow the film to cool following said step of exposing said radiant energy absorbent layer to said radiant energy source.

14. The method of claim 13, wherein said step of allowing the film to cool includes conductive heat transfer to the substrate, conductive heat transfer to said radiant energy absorbent layer, and radiant heat transfer from said radiant energy absorbent layer to a surrounding environment.

15. A method of rapid thermal annealing of a film on a substrate of a semiconductor device comprising the steps of:
    processing the semiconductor device to create the film on the substrate;
    covering the film to a thickness of between 1,000 and 10,000 angstroms with a sacrificial layer of amorphous silicon;
    exposing said sacrificial layer to a xenon arc lamp for a period sufficient to allow the film to conductively absorb heat from said sacrificial layer, sufficient heat being absorbed by the film from said sacrificial layer to reach an annealing temperature;
    cooling the film through conduction to the substrate and through heat transfer back to said sacrificial layer and from said sacrificial layer to a surrounding environment; and
    etching said sacrificial layer to remove said sacrificial layer from the semiconductor device.

* * * * *